United States Patent
Boarin et al.

(10) Patent No.: US 7,463,903 B2
(45) Date of Patent: Dec. 9, 2008

(54) HIGH SPEED INTERFACE FOR RADIO SYSTEMS

(75) Inventors: Gianluigi Boarin, Belgioioso (IT); Francesco Adduci, Milan (IT); Mattia Oddicini, Montaldo Bormida (IT); Salvatore Matteo Crudo, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 327 days.

(21) Appl. No.: 10/653,704

(22) Filed: Sep. 2, 2003

(65) Prior Publication Data
US 2004/0077317 A1 Apr. 22, 2004

(30) Foreign Application Priority Data
Sep. 2, 2002 (EP) .................................. 02425547

(51) Int. Cl.
*H04M 1/00* (2006.01)
(52) U.S. Cl. ................ 455/553.1; 455/552.1; 455/551; 455/130; 455/132
(58) Field of Classification Search ................ 455/137, 455/132, 271, 130, 553.1
See application file for complete search history.

(56) References Cited

U.S. PATENT DOCUMENTS

| 4,843,339 | A | * | 6/1989 | Burt et al. ...................... 330/10 |
| 5,550,872 | A | * | 8/1996 | Liberti et al. ................. 375/347 |
| 5,666,659 | A | * | 9/1997 | Kernahan et al. .............. 455/43 |
| 5,715,244 | A | * | 2/1998 | Park et al. ..................... 370/335 |
| 6,275,526 | B1 | | 8/2001 | Kim |
| 6,842,610 | B2 | * | 1/2005 | Maeda et al. ................. 455/260 |
| 2001/0007136 | A1 | * | 7/2001 | Tamura et al. ............... 713/500 |
| 2002/0183025 | A1 | * | 12/2002 | Seaberg et al. .............. 455/132 |
| 2003/0042957 | A1 | * | 3/2003 | Tamura ....................... 327/233 |
| 2004/0063409 | A1 | * | 4/2004 | Boehm et al. ................ 455/130 |
| 2005/0113048 | A1 | * | 5/2005 | Miyahara et al. ............ 455/137 |

FOREIGN PATENT DOCUMENTS

| EP | 0 163 313 | 12/1985 |
| GB | 2 326 036 | 12/1998 |
| WO | WO 02/067450 | 8/2002 |

OTHER PUBLICATIONS

European Search Report dated Feb. 19, 2003 for Application No. 02 42 5547.

* cited by examiner

*Primary Examiner*—Nay Maung
*Assistant Examiner*—Richard Chan
(74) *Attorney, Agent, or Firm*—Lisa K. Jorgenson; Jon A. Gibbons; Fleit Gibbons Gutman Bongini & Bianco P.L.

(57) ABSTRACT

The present invention relates to a high-speed interface for radio systems, in particular to a synchronous serial digital interface for a car radio. In an embodiment, the synchronous serial digital interface for at least dual radio receiver systems includes a master device and a slave device. The dual radio receiver system has an intermediate frequency. The master device and the slave device exchange data in a bi-directional manner on at least one communication channel; the master device and the slave device have a unique bit clock; the master device supplies a synchronization signal to the slave device. The synchronization signal has a frequency spectrum with an amplitude at the intermediate frequency lower than the amplitudes at the other frequencies of the synchronization signal.

6 Claims, 2 Drawing Sheets

HIGH SPEED INTERFACE FOR RADIO SYSTEMS

CROSS-REFERENCE TO RELATED APPLICATIONS

This application is based upon and claims priority from prior European Patent Application No. 02425547.3, filed on Sep. 2, 2002 the entire disclosure of which is herein incorporated by reference.

FIELD OF THE INVENTION

The present invention generally relates to a high-speed interface for radio systems, in particular to a synchronous serial digital interface for car radios.

BACKGROUND OF THE INVENTION

In radio applications, electro-magnetic interference is an important issue.

Further, very high scale integration includes embedding many functions on CMOS technology in smaller and smaller chip areas. In order to cover a wide range of different customer requirements, while minimizing the number of dedicated chips required, device manufacturers have adopted a modular approach, for example, a radio system operated with low power analog signals from antennas and tuner front-ends.

The literature for radio systems describes a wide variety of digital interfaces to reduce as much as possible electro-magnetic emission. The literature for radio systems, although providing useful information for reducing electro-magnetic emission, does not address the electro-magnetic emission problems with dual or multi tuner radio receivers where switching noise contributes significantly to performance degradation.

Accordingly, a need exists to overcome the problems with the prior art and to provide a system for reducing the electro-magnetic emissions in multi tuner radio receivers.

SUMMARY OF THE INVENTION

The present invention provides a system to overcome the problems with the prior art and provides a high-speed interface for radio systems and in particular for car radio systems.

The present invention includes a synchronous serial digital interface for multi radio receiver systems comprising a master device and a slave device. The multi radio receiver systems have an intermediate frequency. The master device and the slave device exchange data in a bi-directional manner on at least one communication channel. The master device and the slave device have a unique, or single, bit clock. The master device supplies a synchronization signal to the slave device. The synchronization signal has a frequency spectrum with an amplitude at the intermediate frequency lower than the amplitudes at the other frequencies Of the synchronization signal.

Furthermore according to the present invention, an antenna diversity system for radio systems includes a synchronous serial digital interface.

The present invention provides an interface compatible with systems combining low emission, high speed, and high data transfer efficiency. The characteristic of the present invention provides very low electro-magnetic emission, resulting in a very quiet interface. The present invention can easily and be freely integrated in multi tuner radio components while reducing noise when high rate data transfer operates.

BRIEF DESCRIPTION OF THE DRAWING

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
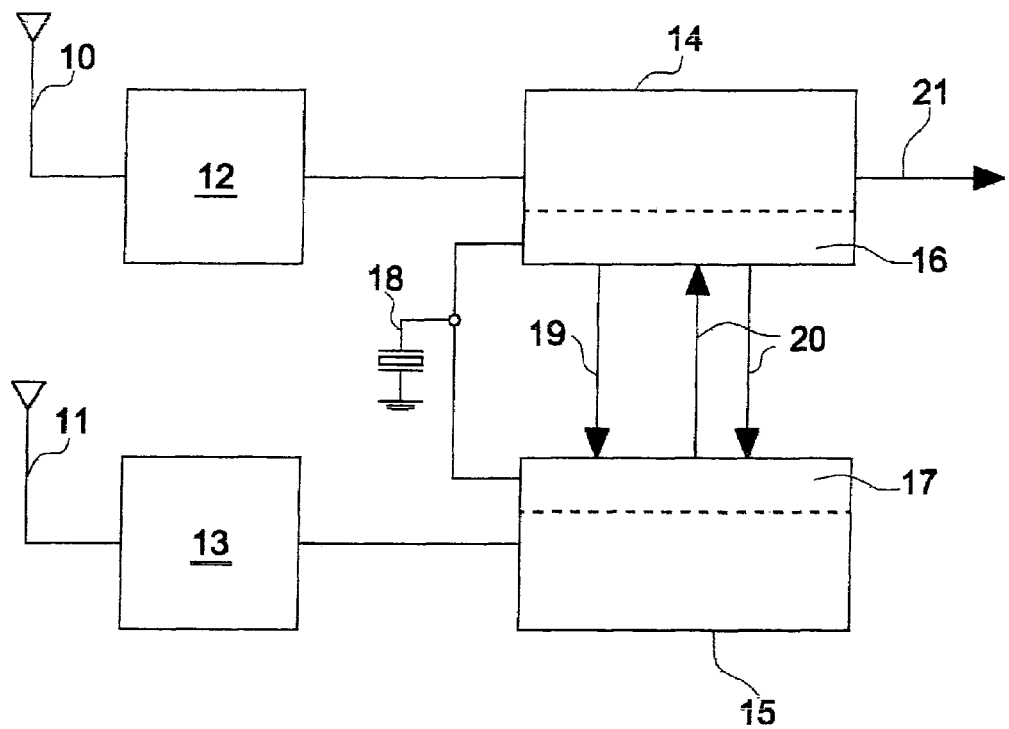
FIG. 1 shows a block scheme of a dual radio receiver system according to the present invention.

The dual radio receiver system shown in FIG. 1, includes two antennas 10 and 11 connected respectively to two tuner front ends 12 and 13, which from antennas 10 and 11 take the RF (radio frequency) and convert it to an IF (intermediate frequency) of 10.7 MHz.

The IF signals coming from the tuner front ends 12 and 13 are supplied, respectively, to two digital signal processors (DSP) 14 and 15.

The digital signal processors 14 and 15 communicate between each other by means of two synchronous serial digital interfaces 16 and 17 (respectively), according to the present invention. The digital interface 16 is to be considered as a master and the digital interface 17 is to be considered as a slave. They use a single clock signal generated by the same crystal quartz 18. The master digital interface 16 supplies to the slave digital interface 17 a synchronization signal 19, and the digital interfaces 16 and 17 exchange their data in a bi-directional way by means of the signals 20. The whole system has only one audio output 21.

To enhance the quality of FM stations, tuner diversity can be adopted, giving an impressive improvement to the reception even in adverse environments, where multi-path and fading effects are dominants, as well as suppressing strong adjacent channels.

According to the present invention two sets of tuner front ends 12 and 13 and digital signal processors 14 and 15 are connected together, to implement an antenna diversity system.

Signals coming from separate antennas are processed in each device, and then are exchanged between them by means of the digital interfaces 16 and 17. In this case, with a proper algorithm, it is possible to enhance the quality of reception. The converted IF signals are gathered into the master device that first analyze field strength of each of them: the one with insufficient field strength is dropped, and the other is chosen; else, if both have significant strength, a proper amplitude and phase correction is performed before summing them. That leads antenna beam forming, which is typically used in Radio Base Band Stations.

On the other hand the data exchange is at a very high rate, very close to IF and FM bandwidth, hence the need to reduce as much as possible radiation from the digital interfaces 16 and 17 is raised. The digital interfaces 16 and 17 do not exchange a high-speed clock, but only a synchronization signal 19 is used to permit data rebuild in the slave interface.

The data rate is, in the present case, 1/256 the crystal frequency, i.e. 74.1 MHz/256=289.45 kHz. Word length is 16 bits, and 2 words are transmitted and/or received at a time, which leads to a bit rate for each channel of 289.45 kHz*16*2=9.2625 Mbit/sec. The synchronization signal synchronises the digital interfaces 16 and 17 on its rising edge. Whereas in slave mode the synchronization signal is received and extracted to internally initialise the blocks and send synchronously back the slave data stream.

The master interface 16 does not need to send a bit clock signal to the slave because both interfaces run off same crystal so instantly they are at exactly the same frequency, and the slave only needs to recover the proper phase to latch data in. The same clock phase is used by the slave to send out its own data.

Figure 2:
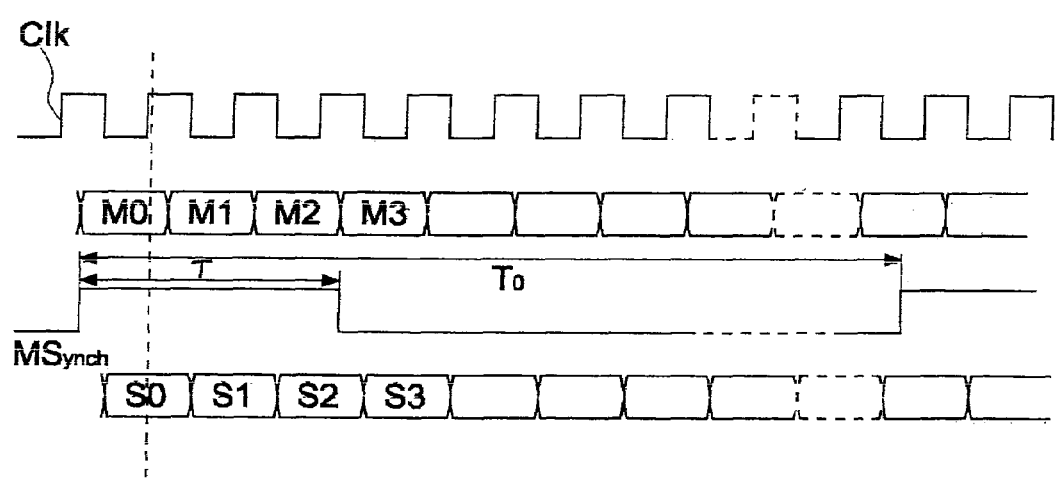
FIG. 2 shows the timing diagram of the transfer data.

Referring now to FIG. 2, the master interface 16 sends data Mi with a bit clock Ck running at 9.2625 MHz, and a synchronization signal MSynch with a rising edge (the synchronization will be on the slave chip upon the rising edge of it) at the synchronization rate Fs or period $T_0$. At the rising edge of the synchronization signal, the transmission of data from the master interface 16 starts toward the slave interface 17.

The duty cycle $D=\tau/T_0$ of the synchronization signal MSynch can be adjusted among different values, at which the interference around the IF frequency (10.7 MHz) is minimised.

The slave interface 17 is such that the master interface 16 can capture the slave Si bit at the rising edge of the master bit clock Ck just after the one which has previously generated the master Mi bit.

Data line has the maximum frequency of 9.26 MHz/2= 4.63 MHz, when transmitting or receiving a sequence of 101010 . . . , in general it can be assumed that the data sequence is random, thus spreading its frequency spectrum over the band.

The synchronization signal gives the start of the frame, and the serial interface uses one of its edges to extract the synchronization and to recover from serial to parallel format the data upon reception. One choice of the synchronization signal is a square wave with a duty cycle $D=\tau/T_0$, where $T_0$ is the period and $\tau$ is the time when the synchronization signal is on.

The Fourier series expansion of a generic periodic function with period $T_0$ is:

$$F(t) = A_0 + \sum A_n \cos\left(2\pi n \frac{t}{T_0}\right) + \sum B_n \cos\left(2\pi n \frac{t}{T_0}\right)$$

where $$A_0 = \frac{1}{T_0} \int_{-T_0/2}^{T_0/2} F(t)\,dt$$

$$A_n = \frac{1}{T_0} \int_{-T_0/2}^{T_0/2} F(t)\cos\left(2\pi n \frac{t}{T_0}\right) dt$$

$$B_n = \frac{1}{T_0} \int_{-T_0/2}^{T_0/2} F(t)\sin\left(2\pi n \frac{t}{T_0}\right) dt$$

So where F(t) is a square wave with duty cycle $D=\tau/T_0$ we have:

$$A_0 = \tau/T_0 = D$$

$$A_n = \frac{2\pi}{T_0} \frac{\sin\left(\pi n \frac{\tau}{T_0}\right)}{\pi n \frac{\tau}{T_0}} = 2D \frac{\sin(\pi n D)}{\pi n D}$$

$$B_n = 0$$

Being $T_0=1/289.45$ KHz, the 37th harmonics, that is 289.45 KHz*37=10.7095 MHz, falls inside the IF bandwidth (10.7 MHz). So, the 37th coefficient of the Fourier series must be 0 or close to it, which leads to $\sin(\pi n D)=0$ or $37*\pi n*D=k*\pi$, or $37*D=k$ where k is any whole number. Hence we have to choose $D=k/37$. Being our time resolution 1/74.1 MHz we have $D=\delta/256$, with $\delta$ any integer number within the range $0<\delta<256$. The best we can have is $\delta=83$, which leads $A_{37}/A_0=2 \sin(37*\pi*83/256)/(37*\pi)$, that is about −73 dB. Therefore, a preferable value for $\tau$ is $\tau=D*T_0=\delta/256 *T_0= (83/256)*(1/289.45$ KHz).

It is important to note that other values have been advantageously shown to provide good rejection at the interfering harmonic, for example value of D comprised between D=75/256 and D=90/256.

The rejection can be easily further reduced by increasing $T_0$ by a multiple M of it, for example 10 times, so that we have to consider the 37*M harmonic.

Alternatively, for a even better spreading of noise coming from harmonics of synchronization signal, the duty cycle can be changed on the fly with a pseudo-random numeric sequence, thus giving more reduction to in-band interference. This can be easily performed by varying the value of $\delta$ from 1 to 127: a counter from 0 to 255 and a comparator with variable threshold originated of the synchronization signal; by varying the threshold with a pseudo random sequence of numbers from 1 to 127, for example stored in a look-up table, the duty cycle $\delta/D$ is modulated, and harmonics peak level reduced, thus whitening the noise due to radiation.

Figure 3:
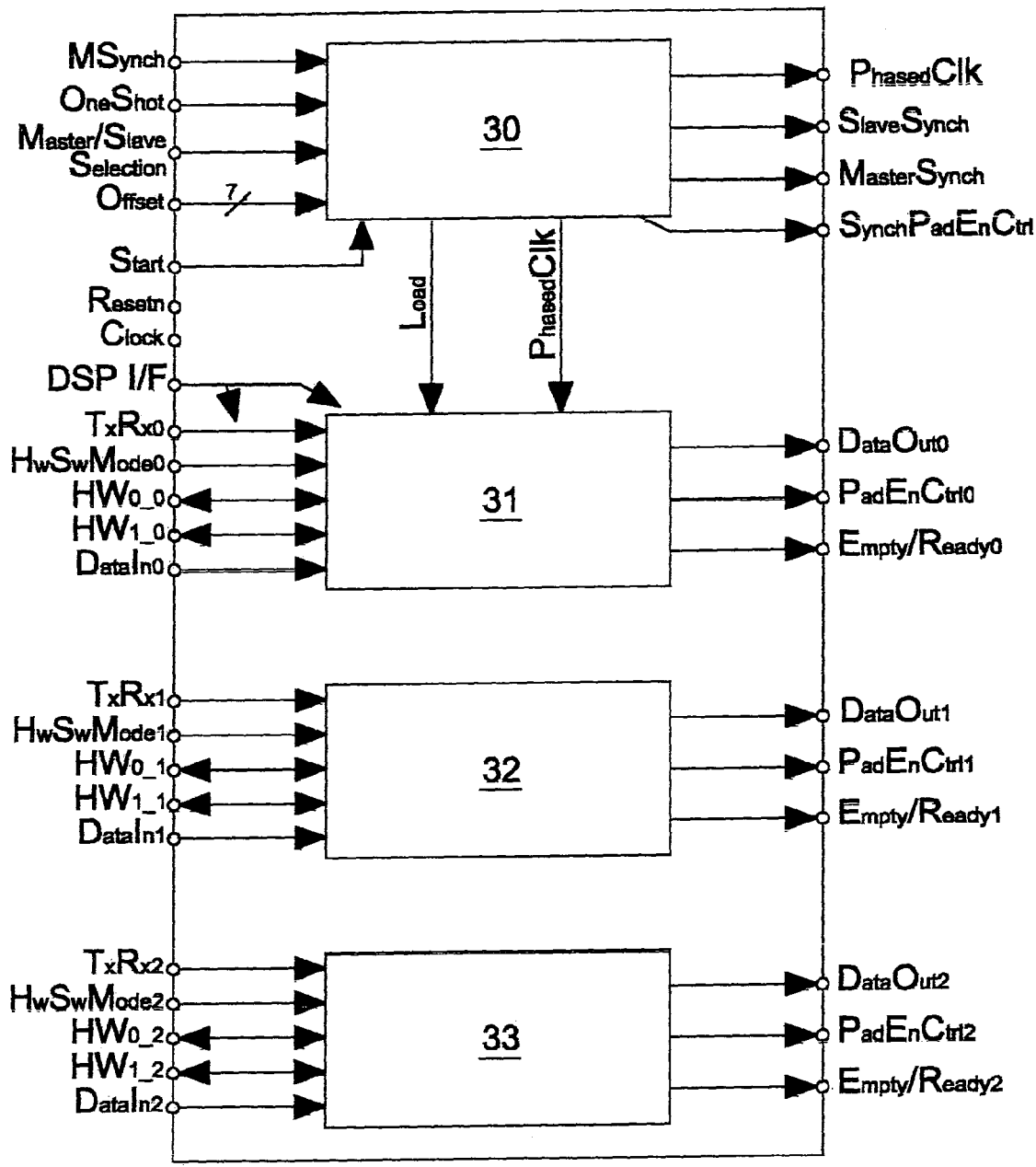
FIG. 3 shows chip comprising an interface according to the present invention.

Referring now to FIG. 3, the interface can be partitioned in two main modules: the synchronization signal manager 30, and the channel management blocks 31, 32, 33. It also contains the control status register (not shown), responsible for the set-up configuration of synchronization and channel blocks.

In this specification the number channel management blocks 31, 32, 33 are three, but can be any number, i.e. many blocks of the same kind can be placed more than once, provided that the control status register contains enough bits for proper set-up configuration and data.

There are two main configurations of the interface, mutually exclusive.

The master one: in this case the interface is responsible for synchronization signal generation MSynch, and gives the proper duty cycle shaping.

The slave one: in this case the interface is responsible for recovery of the synchronization from the reception of master synchronization signal MSynch, and it also synchronises all the channel blocks of the slave. It can also be used for the slave interface synchronization.

When in master mode a down-up counter counting from 0 to 255 by 1 step and clocked at 74.1 MHz provides the basic waveform for the MSynch signal to be output as master to the slave. It is then shaped with an offset, selectable from external by a register in the range 1 to 127, of which resulting MSB is the Msynch (as aforesaid); the duty cycle is D=offset/256. The offset should be set as described above. Internally the data are handled in parallel, thus a parallel to serial in transmit mode, and serial to parallel in receive mode conversions are needed. The 8 bit counter overflow is the load signal for the parallel to serial or serial to parallel conversion in the channel management block, which performs the conversion, and send/receive data to/from the electrical interface.

When in slave mode the clock divide by 8 samples the incoming MSynch (from external master) with four 90 degrees off phase clocks at 9.26 MHz frequency. It defines the window, where the MSynch has its rising edge. The clock phase selector selects one out of the four phases (clk0, clk90, clk180, clk270), to be used as slave clock in the channel managers (PhasedClk). It also provides a synchronization pulse at 74.1 MHz to synchronise the 8 bit counter, and in turn the load operation, as well as a slave synchronization to be used elsewhere in the slave interface (for instance to resynchronise the slave interface to the master one). The interface also has a reset from outside and needs a 74.1 MHz system clock. A start signal is also available to synchronization the interface when in master mode.

The synchronization signal manager 30 has the one shot feature which enables the MSynch out just once in a 32 bit data frame upon request. This is to have the quietest environment possible, where the synchronization between the two interfaces is done just once for example at the very beginning, or upon request by software.

Here the serial in/out data are handled, together with the parallel to serial and serial to parallel interface. The write and read operation to data registers can be done either from digital signal processors or to/from an hardware block, hooked up to it.

Even in channel management block there are two main configurations of the channel.

The transmitter one: parallel data are read from digital signal processors or other block, and properly loaded into the 32 bit register to be sent out serially at 9.26 MHz rate.

The receiver one: the 32 bit register serially reads in data from master, with proper re-phased 9.26 MHz, then transferred to the digital signal processors register for parallel read from outside The 32 bit register is essentially a mono directional 32 bit shift register, which can be up-loaded either from parallel bus (from DSP registers for instance) or from serial line (DataIn in our case), hooked up to the first bit, or can download its contents to parallel registers or to the serial out line (DataOut).

The signals of the interface, according to the present invention, are the followings.

Inputs.
Clock: system clock at 74.1 MHz.
Resetn: main reset of all the sequential circuitry. Active Low.
Start: for resynchronization of all counters and internal synchronization signals.
MSynch: in Slave mode, synchronization signal from external Master interface.
HW0_0,_1,_2: data input to last 16 bit of sent/received serial data of respectively Channel Management Blocks 0, 1, 2.
HW1_0,_1,_2: data input to first 16 bit of sent/received serial data of respectively Channel Management Blocks 0, 1, 2.
DataIn0, 1, 2: serial data in receiver mode.
Outputs.
PhasedClk: phased clock output, to be used externally as signal (e.g. test purposes).
Slave Synch: 1 pulse at 74.1 MHz frequency, to be used as external synchronization in Slave mode.
Master Synch: synchronization output signal when in master mode, with duty cycle controllable.
SynchPadEnCtrl: controls direction of the synchronization output. High impedance when in slave mode, output when in master mode.
DataOut0, 1,2: serial data out in transmitter mode.
PadEnCtrl0, 1, 2: gives direction to the InOut serial data pad, High impedance when in receiver mode, output when in transmitter mode.
Registers.
DSPIF: data address interface (in/out) to the DSP core, for communication to it.
Master/Slave Selection: bit which selects between Master (High) and Slave (Low). At reset it is Low (Slave).
Offset: 7 bit value, which gives the offset for Master Synch output duty cycle. At reset equals 0.
OneShot: when enabled, and in Master Mode the Master Synch is applied once in a data frame.
TxRx0, 1, 2: for each block 1 bit select for transmitter (High), receiver (Low) mode. At reset is Low (Receiver).
HwSwMode0, 1, 2: for each block 1 bit select for up/download from to either DSP (Low) or Hw block (High). At reset it is Low (DSP).

Preferably, the interface according to the present invention, as disclosed in FIG. 3, is carried out in a single chip.

The number of channels can be extended, since each channel management block is fully independent of each other. In a dual antenna diversity system, the typical configuration is with master having two receiving channels (generally IF in phase and quadrature signals), and one transmitting channel, which is used for instructing the slave device.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A multi tuner radio receiver system comprising:
at least a first tuner and a second tuner forming a set of at least two tuners, each producing an intermediate frequency; and
a master device electrically coupled to at least the first tuner for receiving the intermediate frequency therefrom and a slave device electrically coupled to at least the second tuner for receiving the intermediate frequency therefrom, wherein the master device and the slave device exchange data in a bi-directional manner on at least one communication channel and wherein the master device and the slave device share a single clock;
wherein the master device supplies to the slave device a synchronization signal MSynch characterized by a duty cycle D such that its frequency spectrum has an amplitude $A_0$ equal to the duty cycle D at the intermediate frequency IF and the duty cycle D is adjusted so interference caused by the amplitude $A_0$ of the synchronization signal MSynch around the intermediate frequency IF is minimized.

2. The multi tuner radio receiver according to claim 1, wherein the synchronization signal has a duty cycle in an inclusive range of 75/256 through 90/256 Mhz.

3. The multi tuner radio receiver according to claim 1, wherein the synchronization signal has a duty cycle variable according to a pseudo-random numeric sequence.

4. The multi tuner radio receiver according to claim 1, wherein the slave device does not supply a synchronization signal to the master device.

5. The multi tuner radio receiver according to claim 1, wherein the master device receives a slave bit at a rising edge of the single clock immediately after a previously generated master bit.

6. The multi tuner radio receiver according to claim 1, wherein a rising edge of the synchronization signal begins a transmission of data from the master device to the slave device.

* * * * *